(12) United States Patent
Kakegawa et al.

(10) Patent No.: US 10,156,014 B2
(45) Date of Patent: Dec. 18, 2018

(54) GAS TREATMENT APPARATUS AND GAS TREATMENT METHOD

(71) Applicant: TOKYO ELECTRON LIMITED, Tokyo (JP)

(72) Inventors: Takashi Kakegawa, Nirasaki (JP); Yuichi Furuya, Nirasaki (JP); Daisuke Toriya, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/843,551

(22) Filed: Dec. 15, 2017

(65) Prior Publication Data

US 2018/0171478 A1 Jun. 21, 2018

(30) Foreign Application Priority Data

Dec. 21, 2016 (JP) ................. 2016-248113

(51) Int. Cl.
| | | |
|---|---|---|
| *C23C 16/455* | (2006.01) | |
| *H01L 21/285* | (2006.01) | |
| *C23C 16/06* | (2006.01) | |
| *H01L 21/687* | (2006.01) | |

(52) U.S. Cl.
CPC ........ *C23C 16/45544* (2013.01); *C23C 16/06* (2013.01); *C23C 16/45565* (2013.01); *H01L 21/28568* (2013.01); *H01L 21/68742* (2013.01)

(58) Field of Classification Search
None
See application file for complete search history.

(56) References Cited

U.S. PATENT DOCUMENTS

| | | | | |
|---|---|---|---|---|
| 2010/0310772 A1* | 12/2010 | Tsuda | ............... | C23C 16/409 427/255.28 |
| 2014/0090599 A1* | 4/2014 | Saitou | ............... | B05B 1/005 118/728 |
| 2015/0187593 A1* | 7/2015 | Narushima | ......... | H01L 21/6708 438/735 |
| 2015/0267298 A1* | 9/2015 | Saitou | ............... | C23C 16/45565 118/725 |

(Continued)

FOREIGN PATENT DOCUMENTS

| | | |
|---|---|---|
| JP | 2014-57047 A | 3/2014 |
| JP | 2016-117933 A | 6/2016 |

*Primary Examiner* — Angel Roman
(74) *Attorney, Agent, or Firm* — Nath, Goldberg & Meyer; Jerald L. Meyer

(57) ABSTRACT

A gas treatment apparatus includes: a mounting part of a substrate; a gas diffusion plate of a processing gas; gas dispersion parts forming a diffusion space of the processing gas between the gas dispersion parts and the gas diffusion plate; and a flow path having an upstream side forming a common flow path of the gas dispersion parts and a downstream side connected to each of the gas dispersion parts, lengths from the common flow path to respective of the gas dispersion parts being aligned, wherein centers of the gas dispersion parts are located around a central portion of the diffusion space, and the gas dispersion parts are arranged along first circles with two or more of the gas dispersion parts arranged on each of the first circles and distances from the central portion of the diffusion space to the centers of gas dispersion parts being different from one another.

6 Claims, 18 Drawing Sheets

(56) References Cited

U.S. PATENT DOCUMENTS

2016/0177445 A1\* 6/2016 Takahashi ......... C23C 16/45544
                                                    118/728
2017/0372914 A1\* 12/2017 Yamashita .......... H01J 37/3244
2018/0112309 A1\* 4/2018 Kamio .................... C23C 16/34

\* cited by examiner

FIG. 5

GAS TREATMENT APPARATUS AND GAS TREATMENT METHOD

CROSS-REFERENCE TO RELATED APPLICATION

This application is based upon and claims the benefit of priority from Japanese Patent Application No. 2016-248113, filed on Dec. 21, 2016, the entire contents of which are incorporated herein by reference.

TECHNICAL FIELD

The present disclosure relates to a technique for processing a substrate by supplying a processing gas to the substrate.

BACKGROUND

A process of manufacturing a semiconductor device includes a film forming process performed on a semiconductor wafer (hereinafter referred to as a wafer) as a substrate by atomic layer deposition (ALD), chemical vapor deposition (CVD) or the like. In general, this film forming process requires that a film be formed to have a film thickness with high uniformity in the plane of a wafer. For example, there has been proposed a film forming apparatus including a shower head facing a substrate, a ceiling plate member facing the shower head and disposed above the shower head with a diffusion space of a film forming gas interposed therebetween, and a plurality of gas dispersion parts installed in the ceiling plate member along concentric circles centered at the center of the diffusion space when viewed from top. The gas dispersion parts have discharge ports of the film forming gas so as to disperse the film forming gas horizontally, thereby performing a film forming process on the substrate with high uniformity.

According to the demand for miniaturization of wiring of semiconductor devices, it has been studied to perform a film forming process on a wafer with higher uniformity. There has also been proposed a processing apparatus for supplying a solvent vapor to a wafer, in which a flow path is formed in a line diagram shape which determines a combination of paths so that a gas is simultaneously discharged from gas discharge ports.

SUMMARY

Some embodiments of the present disclosure provide a technique for supplying a processing gas to a substrate to process the substrate with high in-plane uniformity.

According to one embodiment of the present disclosure, there is provided a gas treatment apparatus that performs a gas treatment by supplying a processing gas to a substrate in a processing chamber under a vacuum atmosphere. The gas treatment apparatus includes: a mounting part installed in the processing chamber and on which the substrate is mounted; a gas diffusion plate which forms a ceiling part located above the mounting part and has a plurality of gas injection openings formed to inject the processing gas in a shower shape; a plurality of gas dispersion parts installed in an opposing part, which faces the gas diffusion plate and is located above the gas diffusion plate via a diffusion space of the processing gas, the plurality of gas dispersion parts having a plurality of gas discharge ports formed along a circumferential direction so as to disperse the processing gas horizontally in the diffusion space; and a flow path of the processing gas, the flow path having an upstream side forming a common flow path common to the plurality of gas dispersion parts and a downstream side branched in a middle of the flow path and connected to each of the plurality of gas dispersion parts, lengths from the common flow path to each of the plurality of gas dispersion parts, respectively, being aligned. The plurality of gas dispersion parts is arranged in a layout in which: centers of each of the plurality of gas dispersion parts are located around a central portion of the diffusion space when viewing the diffusion space from a top view; and the plurality of gas dispersion parts is arranged along a plurality of first circles in a circumferential direction of the diffusion space, with two or more of the plurality of gas dispersion parts arranged on each of the plurality of first circles, and with distances from the central portion of the diffusion space to the centers of each of the plurality of gas dispersion parts being different from one another.

According to another embodiment of the present disclosure, there is provided a gas treatment method that performs a gas treatment by supplying a processing gas to a substrate in a processing chamber under a vacuum atmosphere. The gas treatment method includes: mounting the substrate on a mounting part installed in the processing chamber; injecting the processing gas in a shower shape from a plurality of gas injection openings formed in a gas diffusion plate forming a ceiling part located above the mounting part; dispersing the processing gas in a diffusion space of the processing gas by discharging the processing gas horizontally from a plurality of gas dispersion parts installed in an opposing part, which faces the gas diffusion plate and is located above the gas diffusion plate via the diffusion space, the plurality of gas dispersion parts having a plurality of gas discharge ports formed along a circumferential direction; and supplying the processing gas into a flow path having an upstream side forming a common flow path common to the plurality of gas dispersion parts and a downstream side branched in a middle of the flow path and connected to each of the plurality of gas dispersion parts, lengths from the common flow path to each of the plurality of gas dispersion parts, respectively, being aligned. The plurality of gas dispersion parts is arranged in a layout in which: centers of each of the plurality of gas dispersion parts are located around a central portion of the diffusion space when viewing the diffusion space from a top view; and the plurality of gas dispersion parts is arranged along a plurality of first circles in a circumferential direction of the diffusion space, with two or more of the plurality of gas dispersion parts arranged on each of the plurality of first circles, and with distances from the central portion of the diffusion space to the centers of each of the plurality of gas dispersion parts being different from one another.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a longitudinal cross-sectional view of a gas supply unit in which the gas supply part is installed.

DETAILED DESCRIPTION

Figure 1:
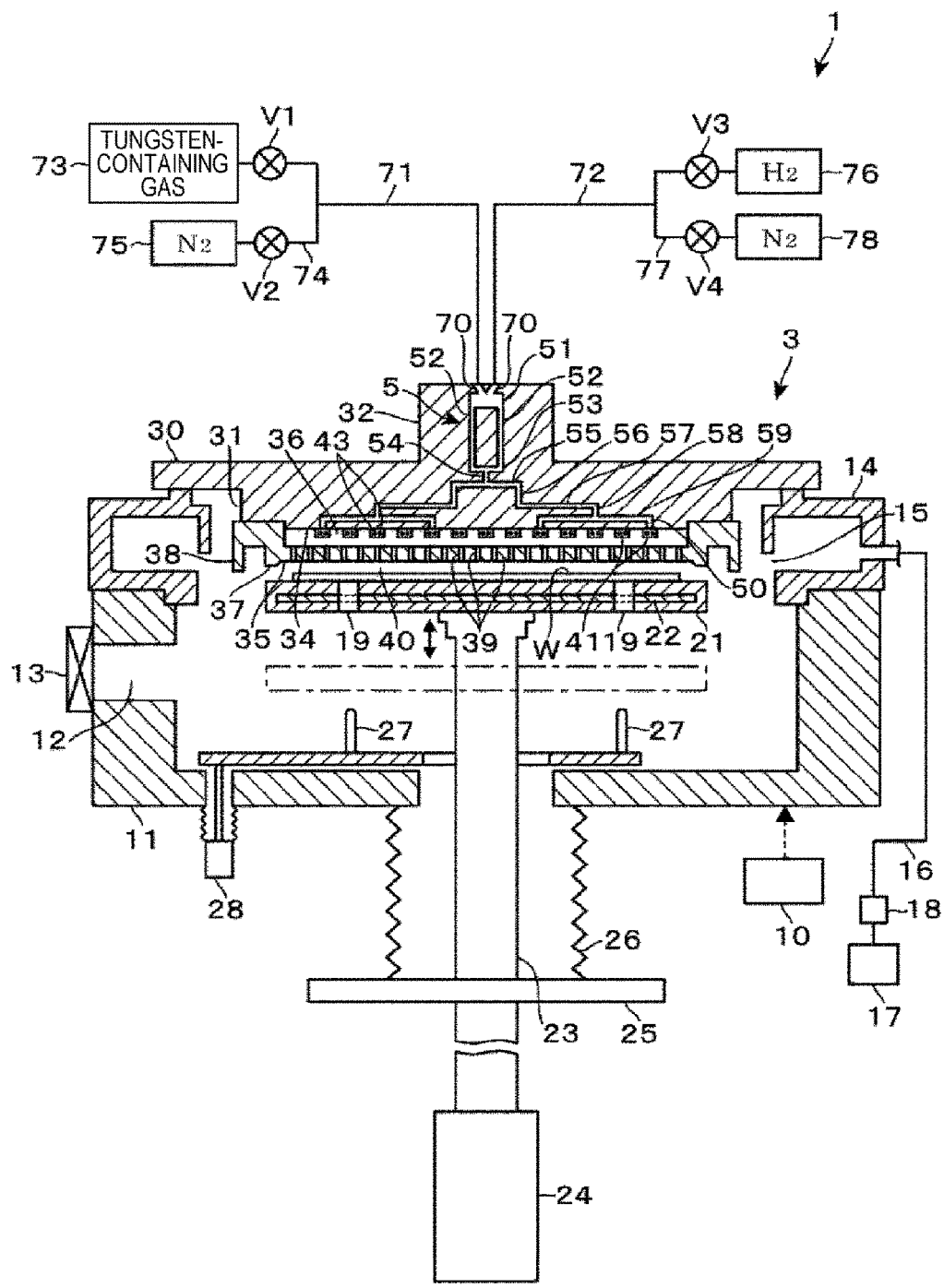
FIG. 1 is a longitudinal cross-sectional view of a film forming apparatus according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

A film forming apparatus 1 which is an embodiment of a gas treatment apparatus of the present disclosure will be described with reference to a longitudinal cross-sectional view of FIG. 1. The film forming apparatus 1 includes a processing container 11 which is a vacuum container in which a wafer W as a substrate is stored and processed, and the interior of the processing container 11 is configured as a processing chamber in which the wafer W is processed. Then, a tungsten-containing gas as a raw material gas and an $H_2$ (hydrogen) gas as a reaction gas are alternately and repeatedly supplied into the processing container 11 to form a W (tungsten) film on the wafer W by ALD. The wafer W has, for example, a circular shape having a diameter of 300 mm. The tungsten-containing gas and the $H_2$ (hydrogen) gas are processing gases used to process the wafer W and are supplied to the wafer W together with an $N_2$ (nitrogen) gas as a carrier gas.

The processing container 11 has a substantially flat circular shape. Although not shown, a heater for heating the side wall of the processing container 11 to a predetermined temperature during a film forming process is installed on the side wall. In addition, a wafer loading/unloading port 12 and a gate valve 13 for opening and closing the loading/unloading port 12 are installed on the side wall of the processing container 11. An exhaust duct 14, which constitutes a part of the side wall of the processing container 11 and is formed by annularly bending a duct having a rectangular longitudinal section, is installed above the loading/unloading port 12. A slit-like opening 15 extending along the circumferential direction is formed in the inner peripheral surface of the exhaust duct 14 to constitute an exhaust port of the processing container 11.

One end of an exhaust pipe 16 is connected to the exhaust duct 14. The other end of the exhaust pipe 16 is connected to an exhaust mechanism 17 constituted by a vacuum pump. A pressure adjusting mechanism 18 constituted by a valve for pressure adjustment is installed in the middle of the exhaust pipe 16. The opening degree of the valve constituting the pressure adjusting mechanism 18 is adjusted based on a control signal output from a control part 10 which will be described later, so that the internal pressure of the processing container 11 is adjusted to a desired vacuum pressure.

A horizontally circular mounting table 21 is installed in the processing container 11. The wafer W is mounted on the mounting table 21 in such a manner that the center of the wafer W coincides with the center of the mounting table 21. A heater 22 for heating the wafer W is buried in the mounting table 21 serving as a mounting part. The upper end of a support member 23 extending vertically through the bottom of the processing container 11 is connected to a central portion of the lower side of the mounting table 21. The lower end of the support member 23 is connected to an elevating mechanism 24. The elevating mechanism 24 enables the mounting table 21 to move up and down between a lower position indicated by a chain line in FIG. 1 and an upper position indicated by a solid line in FIG. 1. The lower position is a delivery position at which the wafer W is delivered to/from a transfer mechanism of the wafer W that enters the processing container 11 from the loading/unloading port 12. The upper position is a processing position at which a process is performed on the wafer W.

Reference numeral 25 in FIG. 1 denotes a flange installed on the support member 23 below the bottom of the processing container 11. Reference numeral 26 in FIG. 1 denotes an expansible bellows having an upper end connected to the bottom of the processing container 11 and a lower end connected to the flange 25, ensuring air tightness inside the processing container 11. Reference numeral 27 in FIG. 1 denotes three support pins (only two are shown in FIG. 1), and reference numeral 28 in FIG. 1 denotes a lift mechanism for lifting up and down the support pins 27. When the mounting table 21 is positioned at the delivery position, the support pins 27 are lifted up and down via through-holes 19 formed in the mounting table 21 to protrude and sink with respect to the upper surface of the mounting table 21, so that the wafer W can be delivered between the mounting table 21 and the transfer mechanism.

A gas supply unit 3 is installed above the exhaust duct 14 so as to close the interior of the processing container 11 from the upper side. The gas supply unit 3 has a flat circular main body 30 having a peripheral portion extending along the exhaust duct 14 and supported by the exhaust duct 14. The central lower part of the main body 30 is configured as a lower protruding part 31 protruding inside the processing container 11 toward the mounting table 21. The central upper part of the main body 30 is configured as an upper protruding part 32 protruding upward.

The lower protruding part 31 has a circular shape when viewed from a top view and the central portion of the lower protruding part 31 further protrudes downward from the peripheral portion thereof to form a step between the central portion and the peripheral portion. The lower surface of the central portion of the lower protruding part 31 is formed as a horizontally flat opposing surface facing the mounting table 21. For example, thirty gas dispersion parts 41 are installed to protrude downward from the opposing surface, as will be described later. A disc-like shower head 35 is installed horizontally below the lower protruding part 31 so as to face the lower surface of the central portion of the lower protruding part 31 and the mounting table 21. The shower head 35 constitutes a ceiling portion of the processing container 11.

Figure 2:
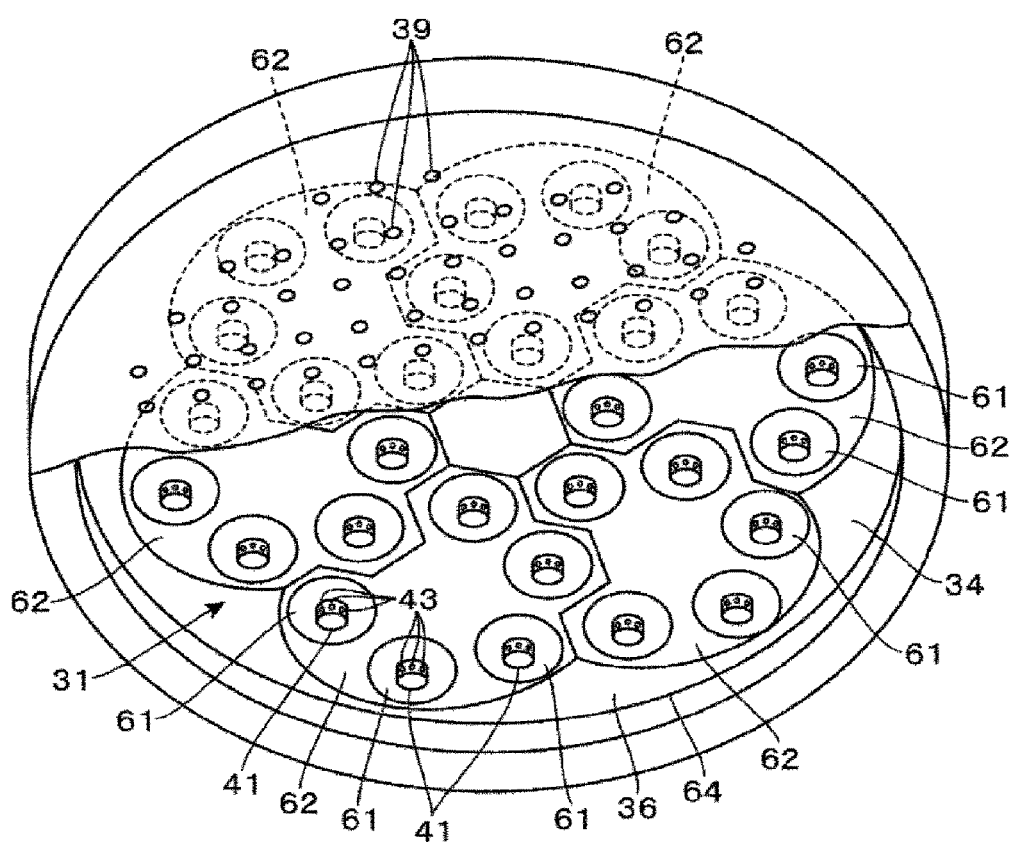
FIG. 2 is a perspective view of a ceding portion of a processing container constituting the film forming apparatus.

The peripheral portion of the shower head 35 has a thick structure so as to be drawn upward and is connected to the peripheral portion of the lower protruding part 31. The space between the shower head 35 and the lower surface of the central portion of the lower protruding part 31 is configured as a diffusion space 36 in which a gas discharged from the gas dispersion parts 41 is diffused. Accordingly, the lower surface of the central portion of the lower protruding part 31 forms a ceiling surface of the diffusion space 36, which will be hereinafter described as a ceiling surface 34. FIG. 2 is a perspective view formed by cutting out a portion of the shower head 35 and illustrates the ceiling surface 34 and the diffusion space 36. The diffusion space 36 is formed in a flat circular shape.

As illustrated in FIG. 1, the peripheral portion of the lower surface of the shower head 35 forms concentric annular protrusions 37 and 38 which project downward and are centered at the center of the shower head 35 when viewed from a top view. However, the annular protrusions 37 and 38 are not shown. These annular protrusions 37 and 38 are protrusions for control of air flow. The annular protrusion 38 is provided further out than the annular protrusion 37. The annular protrusion 37 is close to the peripheral portion of the mounting table 21 at the processing position. The space formed between the shower head 35 and the mounting table 21 inside the annular protrusion 37 when the annular protrusion 37 is close to the mounting table 21 is configured as a processing space 40 for the wafer W.

With respect to the shower head 35, in an inner more region than the protrusion 37, a number of gas injection openings 39 punctured in the thickness direction of the shower head 35 are arranged in a distributed manner and, accordingly, the processing space 40 and the diffusion space 36 communicate with each other via the gas injection openings 39. In this shower head 35, the respective gas injection openings 39 are punctured so that distances between adjacent gas injection openings 39 are equal to each other. For the sake of convenience of illustration, it is shown in each of the drawings that the number of gas injection openings 39 is smaller than the actual number thereof.

Figure 3:
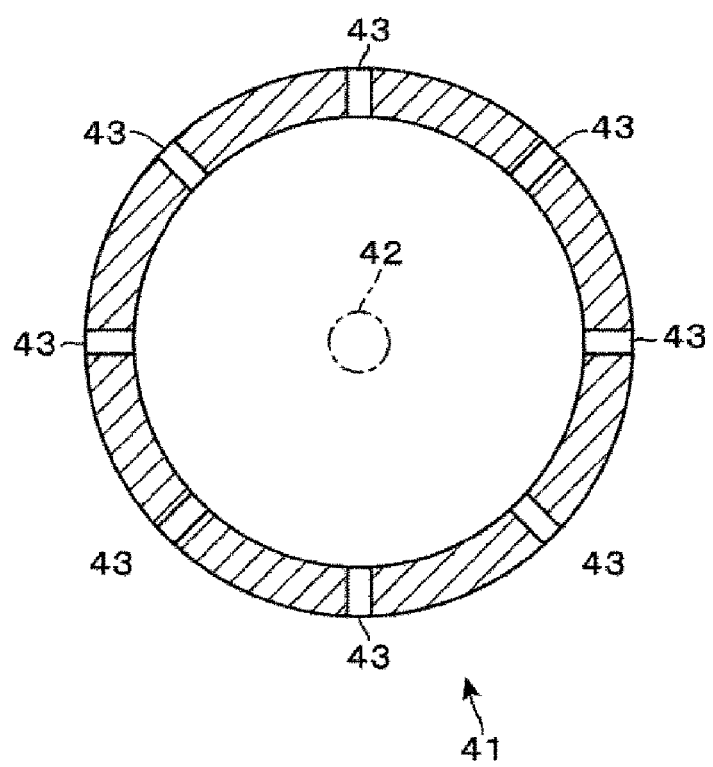
FIG. 3 is a transverse plan view of a gas supply part installed in the ceiling portion.

FIG. 3 is a transverse plan view of the gas dispersion part 41. The gas dispersion part 41 is formed in a flat circular shape and a gas introducing hole 42 is formed at the central portion of the upper side thereof. In addition, a number of gas discharge ports 43 are opened at equal intervals along the circumferential direction on the side surface of the gas dispersion part 41. A gas supplied from the gas introducing hole 42 is discharged horizontally from each gas discharge port 43 and is dispersed in the diffusion space 36.

A gas flow path 5 for introducing the above-mentioned gas in the gas introducing hole 42 of the gas dispersion part 41 is formed in the gas supply unit 3. The outline of the gas flow path 5 will be described. The upstream side of the gas flow path 5 forms a common flow path which is common to, for example, the thirty gas dispersion parts 41. The downstream side of the common flow path branches stepwise like a line diagram which determines a combination of paths, and is connected to the gas introducing hole 42. In more detail, the downstream side of the common flow path branches into six upstream side branch paths, each of the upstream side branch paths branches into five downstream side branch paths, and the downstream end of each of the downstream side branch paths is connected to the gas introducing hole 42. In addition, in order to align the flow rates and flow velocities of a gas supplied to each gas introducing hole 42, the lengths from the common flow path to the gas introducing hole 42 of each gas dispersion part 41 are aligned and the width of each upstream side branch path and the width of each downstream side branch path are also aligned. Further, in order to perform a film forming process with high uniformity on each portion in the plane of the wafer W, the gas dispersion parts 41 are arranged to be spaced apart from one another in the circumferential and radial directions of the ceiling surface 34 forming the diffusion space 36, as illustrated in FIG. 2.

Figure 4:
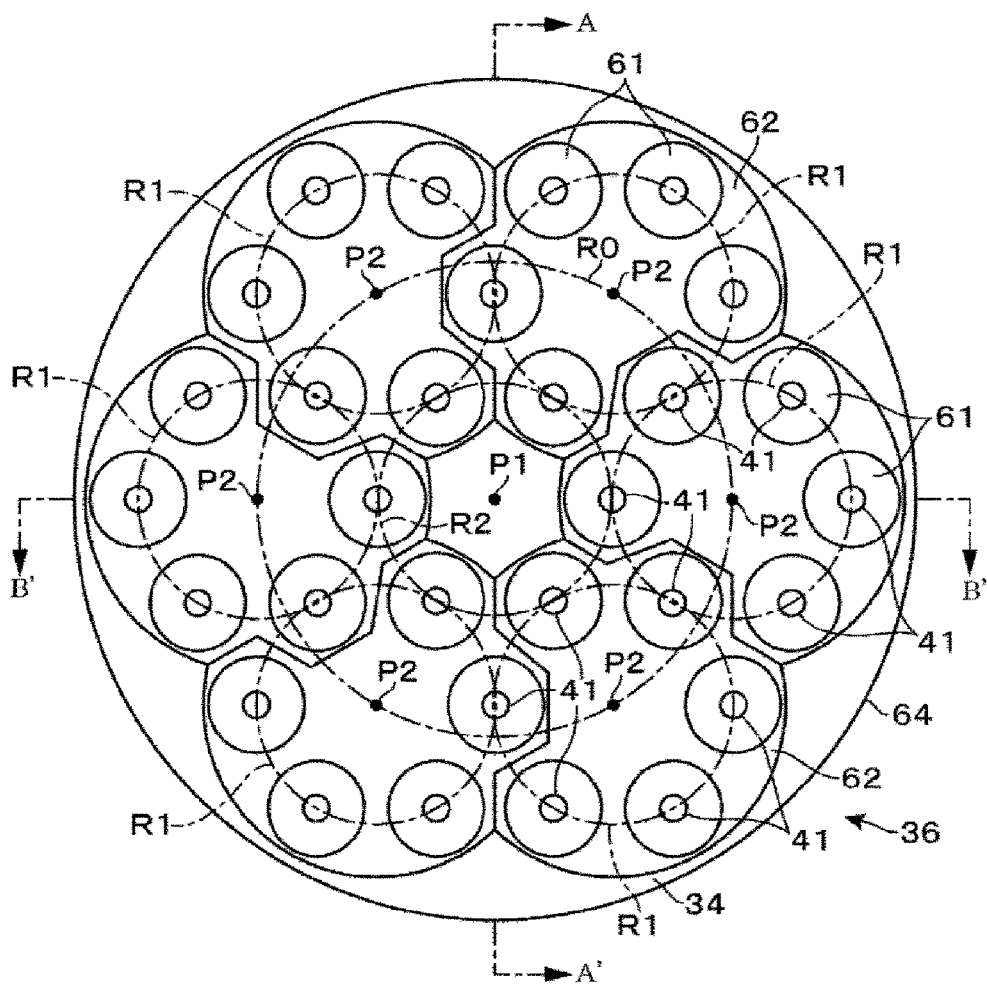
FIG. 4 is a plan view of a ceiling surface of a diffusion space in which the gas supply part is formed.

The layout of the gas dispersion parts 41 will be described in more detail with reference also to FIG. 4 which is a plan view of the ceiling surface 34. In the following description, it is assumed that five gas dispersion parts 41 connected to the same upstream side branch path belong to the same group. A point P1 in FIG. 4 indicates the center of the ceiling surface 34 of the diffusion space 36 and coincides with the center of the mounting table 21. Virtual circles centered at six points P2, which are located on a virtual circle R0 centered at the point P1, are denoted by R1. The points P2 are located at equal intervals in the circumferential direction and the circles R1 have the same diameter. The centers of five gas dispersion parts 41 belonging to the same group and the center of one gas dispersion part 41 belonging to a different group are located on one circle R1. The six gas dispersion parts 41 whose centers are located on the same circle R1 in this manner are arranged at equal intervals along the circumferential direction of the corresponding circle R1.

Further, among the gas dispersion parts 41 belonging to the same group, the gas dispersion part 41 closest to the point P1 is located on a virtual circle R2 whose center is at the point P1. That is to say, the centers of the six gas dispersion parts 41 are located on the circle R2 and these six gas dispersion parts 41 are arranged at equal intervals along the circumferential direction of the circle R2. When viewed from a top view, the distance between the point P1 and each of the centers of the gas dispersion parts 41 located on the circle R2 is, for example, 43.3 mm and the distance between the point P1 and the center of the gas dispersion part 41 located at a position farthest from the point P1 is, for example, 129.9 mm. Therefore, the gas dispersion parts 41 are arranged at a position closer to the center of the diffusion space 36 than the peripheral end position of the wafer W. The diameter of the diffusion space 36 is, for example, 310 mm.

Figure 5:
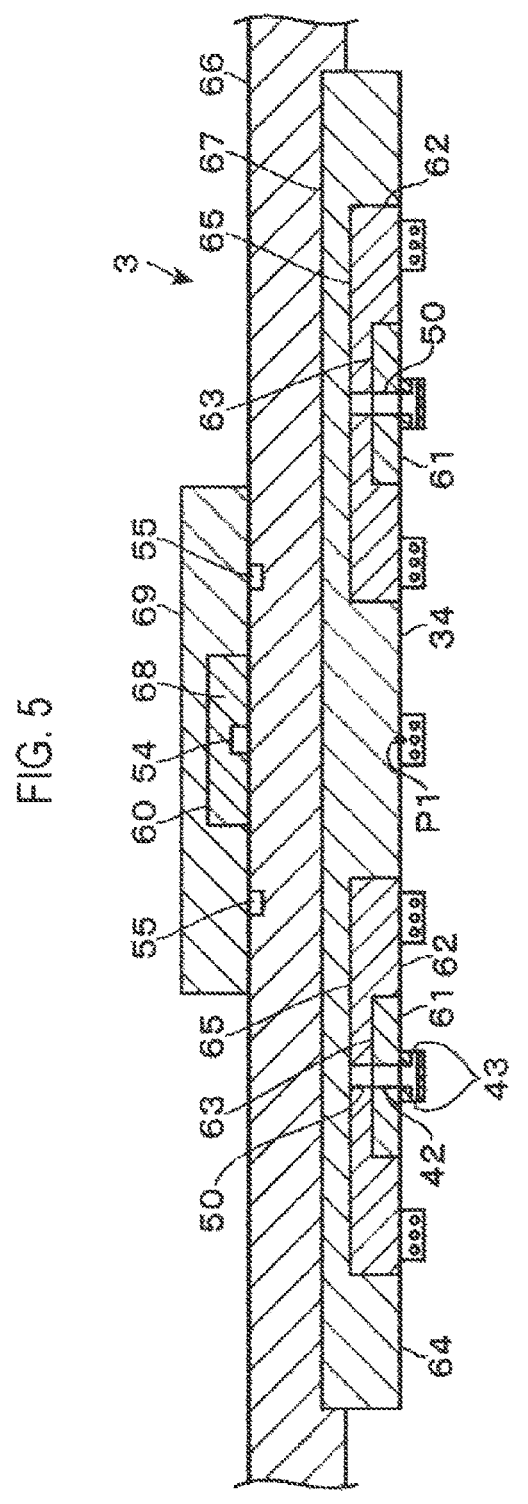
Figure 6:
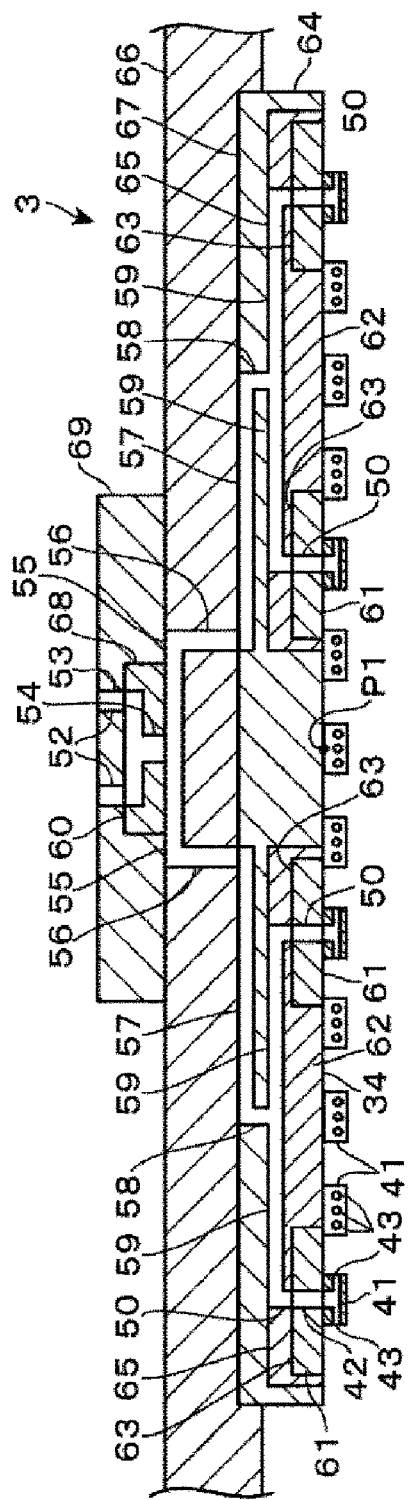
FIG. 6 is a longitudinal cross-sectional view of the gas supply unit.

Subsequently, the above-described gas flow path 5 will be described with reference to FIG. 1 and FIGS. 5 and 6 which are longitudinal cross-sectional views of the gas supply unit 3. FIG. 5 is a cross-sectional view taken along line A-A' in FIG. 4 and FIG. 6 is a cross-sectional view taken along line B-B' in FIG. 4. The cross-section taken along the line A-A' and the cross-section taken along the line B-B' pass through the point P1 at the center of the diffusion space 36 described above and have orientations different by 90 degrees from each other.

In the upper portion of the upper protruding part 32 of the gas supply unit 3, a horizontal flow path 51 into which each gas is supplied from each gas supply source to be described later is formed. The horizontal flow path 51 is formed as a flat horizontal flow path and is located above the central portion of the diffusion space 36. Two ports 70 for introducing gases from the upper side of the horizontal flow path 51 are connected to the horizontal flow path 51 and downstream ends of gas supply pipes 71 and 72 to be described later are respectively connected to the ports 70. In order to align the lengths of the flow paths from the ports 70 to the downstream ends of the gas flow path 5, the ports 70 are opened toward the central portion of the horizontal flow path 51. In addition, vertical flow paths 52 are formed to extend vertically downward from both end portions of the horizontal flow path 51 spaced apart from each other in the lateral direction. The lower ends of the vertical flow paths 52 are respectively connected to both end portions of a flat horizontal flow path 53, which is formed horizontally and are spaced apart from each other in the lateral direction.

A vertical flow path 54 is formed to extend vertically downward from the central portion of the horizontal flow path 53. When viewed from a top view, the center of the vertical flow path 54 coincides with the point P1 at the center of the diffusion space 36 illustrated in FIG. 4. The above-described ports 70, horizontal flow path 51, vertical flow paths 52, horizontal flow path 53 and vertical flow path 54 correspond to the common flow path commonly used to supply gases into each gas dispersion part 41, as described in the outline of the gas flow path 5.

In addition, six horizontal flow paths 55 are formed in the lower side of the vertical flow path 54. Each of the horizontal flow paths 55 is formed in a horizontally extending straight line. The proximal ends of the six horizontal flow paths 55 coincide with each other and the lower end of the vertical flow path 54 is connected to the proximal ends of the horizontal flow paths 55. The distal ends of the six horizontal flow paths 55 extend radially toward the peripheral portion of the diffusion space 36 when viewed from top.

Figure 7:
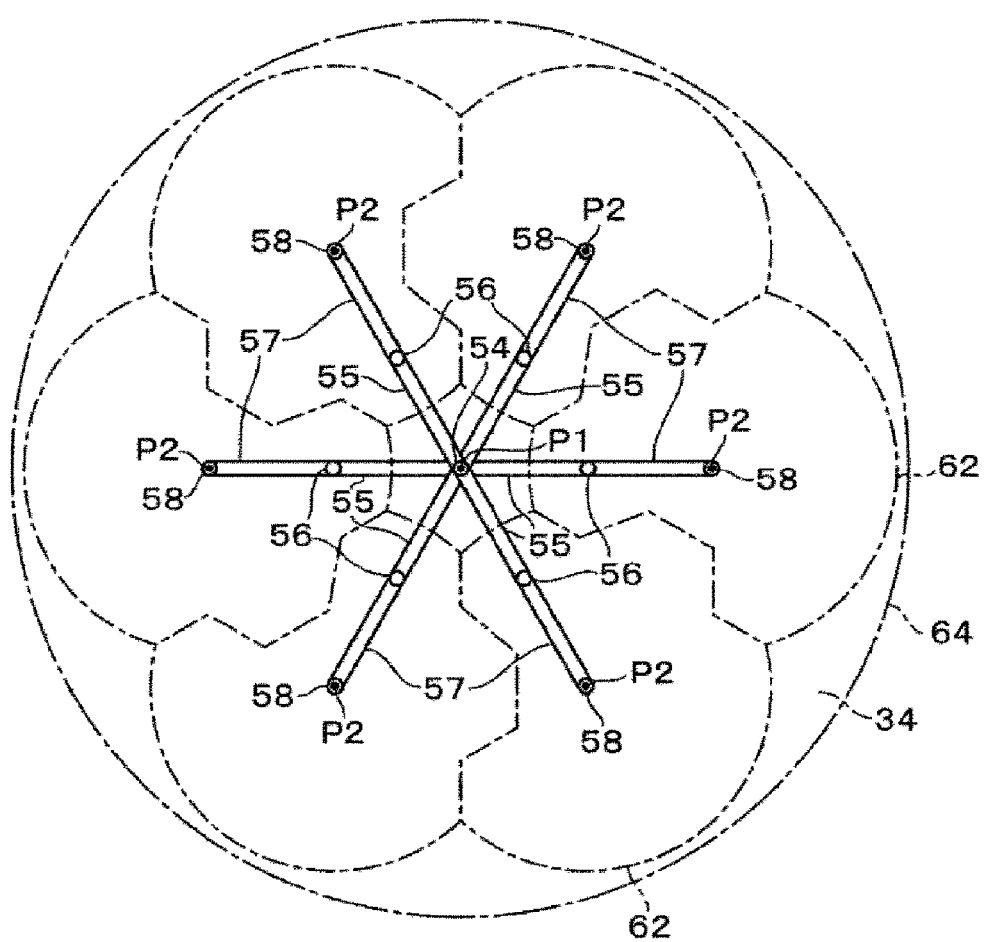
FIG. 7 is a plan view of a gas flow path installed in the gas supply unit.

A vertical flow path 56 is formed so as to extend downward from the distal end of each horizontal flow path 55 and the lower end of the vertical flow path 56 is connected to one end of a horizontal flow path 57 formed in a straight line. The horizontal flow path 57 is formed horizontally so as to extend from the central portion of the diffusion space 36 to the peripheral portion thereof when viewed from a top view. In addition, a vertical flow path 58 is formed so as to extend downward from the other end of the horizontal flow path 57. FIG. 7 illustrates the vertical flow path 54, the horizontal flow path 55, the vertical flow path 56, the horizontal flow path 57 and the vertical flow path 58 when viewed from a top view, in which the center of the vertical flow path 58 coincides with the point P2 shown in FIG. 4. The horizontal flow path 55, the vertical flow path 56, the horizontal flow path 57 and the vertical flow path 58 constitute the upstream side branch paths described as the outline of the gas flow path 5.

Figure 8:
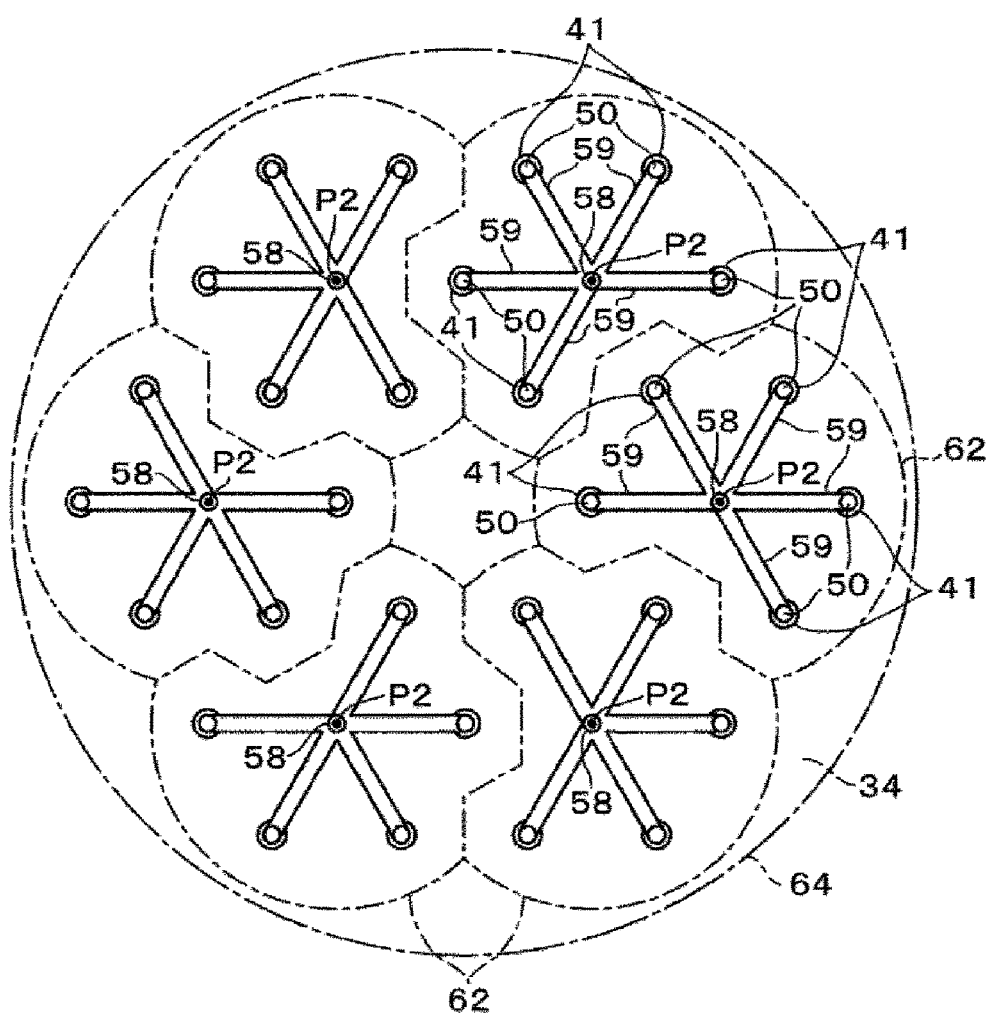
FIG. 8 is a plan view of the gas flow path.

Five horizontal flow paths 59 are formed in the lower side of the vertical flow path 58. Each horizontal flow path 59 is formed in a horizontally extending straight line. The proximal ends of the five horizontal flow paths 59 are coincident with each other and the distal ends of the five horizontal flow paths 59 extend radially toward the peripheral portion of the diffusion space 36 when viewed from a top view. The lower end of the vertical flow path 58 is connected to the proximal end of each horizontal flow path 59. A vertical flow path 50 is formed to extend downward from the distal end of each horizontal flow path 59 and the lower end of the vertical flow path 50 is connected to the gas introducing hole 42 of the gas dispersion part 41. The horizontal flow path 59 and the vertical flow path 50 constitute the downstream side branch paths described in the outline of the gas flow path 5. FIG. 8 illustrates the vertical flow path 58, the horizontal flow path 59, the vertical flow path 50 and the gas distribution part 41 when viewed from a top view.

Regarding the lengths and diameters of the flow paths, the two vertical flow paths 52, the six horizontal flow paths 55, the six vertical flow paths 56, the six horizontal flow paths 57, the six vertical flow paths 58, the thirty horizontal flow paths 59 and the thirty vertical flow paths 50 have the same lengths and diameters, respectively. In more detail for the flow path lengths, the lengths of the respective flow paths from the lower end of the vertical flow path 54, which is the downstream end of the common flow path, to the gas introducing hole 42 of the respective gas dispersion parts 41 are aligned to each other. In addition, as described above, the lengths of the flow paths from the ports 70 corresponding to the upstream end of the common flow path 54 to the respective gas introducing holes 42 are also aligned to each other.

The phrase "the lengths of the flow paths are aligned" means that the lengths of the flow paths fall within an error range of ±1%, for example. More specifically, assuming that the flow path length from the lower end of the vertical flow path 54 to the gas introducing hole 42 of one gas dispersion part 41 is A mm (A is a real number), the flow path lengths are aligned when flow paths from the lower end of the vertical flow path 54 to other gas dispersion parts 41 are formed to have a length that falls within a range of A−(A×1/100) mm to A+(A×1/100) mm. In other words, even if the flow path lengths are not the same and have variations due to errors in assembly accuracy of the apparatus, errors in design accuracy, and the like, the flow path lengths are assumed to be aligned. At least if the lengths from the downstream end of the common flow path to the gas dispersion parts 41 are aligned, this means that the lengths from the common flow path to the gas dispersion parts 41 are aligned.

When the gas flow path 5 is formed as described above, the flow rates and flow velocities of a gas supplied to the gas introducing hole 42 of each gas dispersion part 41 are aligned. As used herein, the phrase "the flow rates are aligned" refers to that, assuming that the flow rate of a gas supplied to one gas dispersion part 41 is B mL/min (B is a real number), the flow rates of the gas supplied to the other gas dispersion parts 41 fall within an error range of ±3%, that is to say, the flow rates of the gas supplied to the gas dispersion parts 41 fall within a range from B−(B×3/100) mL/min to B+(B×3/100) mL/min As used herein, the phrase "the flow velocities are aligned" refers to that, assuming that the flow velocity of a gas supplied to one gas dispersion part 41 is C m/sec (C is a real number), the flow velocities of the gas supplied to the other gas dispersion parts 41 fall within an error range of ±3%.

In addition, the main body 30 and the lower protruding part 31 of the above-described gas supply unit 3 are constituted by vertically stacking a plurality of blocks, each of which has a through-hole and/or a groove formed vertically. The through-hole constitutes a vertical flow path in the gas flow path 5 described above. The groove is formed in the upper portion of the block. When the upper part of the groove is closed by another block stacked on the upper side of the block, a horizontal flow path in the above-described gas flow path 5 is formed.

Each block will now be described with reference to FIGS. 5 and 6. In FIGS. 5 and 6, reference numeral 61 denotes a flat circular block having a through-hole forming the vertical flow path 50. The above-described gas dispersion part 41 is installed below the flat circular block. In FIGS. 5 and 6, reference numeral 62 denotes a flat block, in which a groove forming the horizontal flow path 59 is formed on the upper side of the flat block and a through-hole forming the vertical flow path 50 together with the through-hole of the block 61 is formed at the end portion of the groove. In addition, five concave portions 63 are formed on the lower surface of the block 62 along the circumferential direction and the through-hole formed in the block 62 is opened in the concave portions 63. Five blocks 61 are respectively accommodated in the five concave portions 63 formed in one block 62 and the gas dispersion parts 41 respectively installed in these five blocks 61 belong to the same group.

In FIGS. 5 and 6, reference numeral 64 denotes a flat circular block. A groove forming the horizontal flow path 57 is formed on the upper side of the flat circular block 64 and a through-hole forming the vertical flow path 58 is formed in the end portion of the groove. The through-hole is opened in a concave portion 65 formed in the lower surface of the block 64 and the block 62 is accommodated in the concave portion 65. The above-described ceiling surface 34 is constituted by the lower surfaces of these blocks 61, 62, and 64. In FIGS. 5 and 6, reference numeral 66 denotes a flat circular block. A groove forming the horizontal flow path 55 is formed on the upper side of the flat circular block 66 and a through-hole forming the vertical flow path 56 is formed in the end portion of the groove. The through-hole is opened in a concave portion 67 formed in the lower surface of the block 66 and the upper portion of the block 64 is accommodated in the concave portion 67.

in FIGS. 5 and 6, reference numeral 68 denotes a flat block, in which a groove forming the horizontal flow path 53 is formed on the upper side of the flat block 68 and a through-hole forming the vertical flow path 54 is opened in the groove. In FIGS. 5 and 6, reference numeral 69 denotes a flat block having a through-hole forming the lower side of the vertical flow path 52. The through-hole is opened in a concave portion 60 formed in the lower side of the block 69. The block 69 is placed on the block 66 in a state where the block 68 is accommodated in the concave portion 60. The main body 30 and the lower protruding part 31 of the gas supply unit 3 are constituted by the above-described blocks. Although not shown, a block for constituting the upper protruding part 32 is installed above the block 69 to form the ports 70, the horizontal flow path 51, and the upper sides of the vertical flow path 52 described with reference to FIG. 1. Description for this block will be omitted.

Subsequently, the gas supply pipes 71 and 72 connected to the ports 70 will be described with reference to FIG. 1. The upstream end of the gas supply pipe 71 is connected to a tungsten-containing gas supply source 73 via a valve V1. Further, one end of a gas supply pipe 74 is connected to the downstream side of the valve V1 of the gas supply pipe 71 and the other end of the gas supply pipe 74 is connected to an $N_2$ (nitrogen) gas supply source 75 via a valve V2. The upstream end of the gas supply pipe 72 is connected to an $H_2$ (hydrogen) gas supply source 76 via a valve V3. Further, one end of a gas supply pipe 77 is connected to the downstream side of the valve V2 of the gas supply pipe 72 and the other end of the gas supply pipe 77 is connected to an $N_2$ (nitrogen) gas supply source 78 via a valve V4.

The $N_2$ gas is continuously supplied to each port 70 at all times during a film forming process. When neither a tungsten-containing gas nor an $H_2$ gas is supplied to the port 70, the $N_2$ gas thus supplied acts as a purge gas for removing the tungsten-containing gas or the $H_2$ gas remaining in the processing space 40. When the tungsten-containing gas or the $H_2$ gas is supplied to the port 70, the $N_2$ gas acts as a carrier gas for stably introducing the tungsten-containing gas or the $H_2$ gas into the processing container 11.

Further, the control part 10 composed of a computer is installed in the film forming apparatus 1. The control part 10 includes a program, a memory, a data processor including a CPU, and the like. The program incorporates instructions (steps) to cause the control part 10 to send control signals to various components of the film forming apparatus 1 so that the film forming process described later can be executed. Specifically, the opening/closing timings of the valves, the internal pressure of the processing space 40 by the pressure adjusting mechanism 18, the temperature of the wafer W by the heater 22 of the mounting table 21, the temperature of the processing space 40 by the heater 22 and the heater installed in the side wall of the processing container 11, and the like are controlled by the program. This program is stored in a storage medium such as a compact disk, a hard disk, an MO (Magneto-Optical disk) or the like and is installed in the control part 10.

Figure 9:
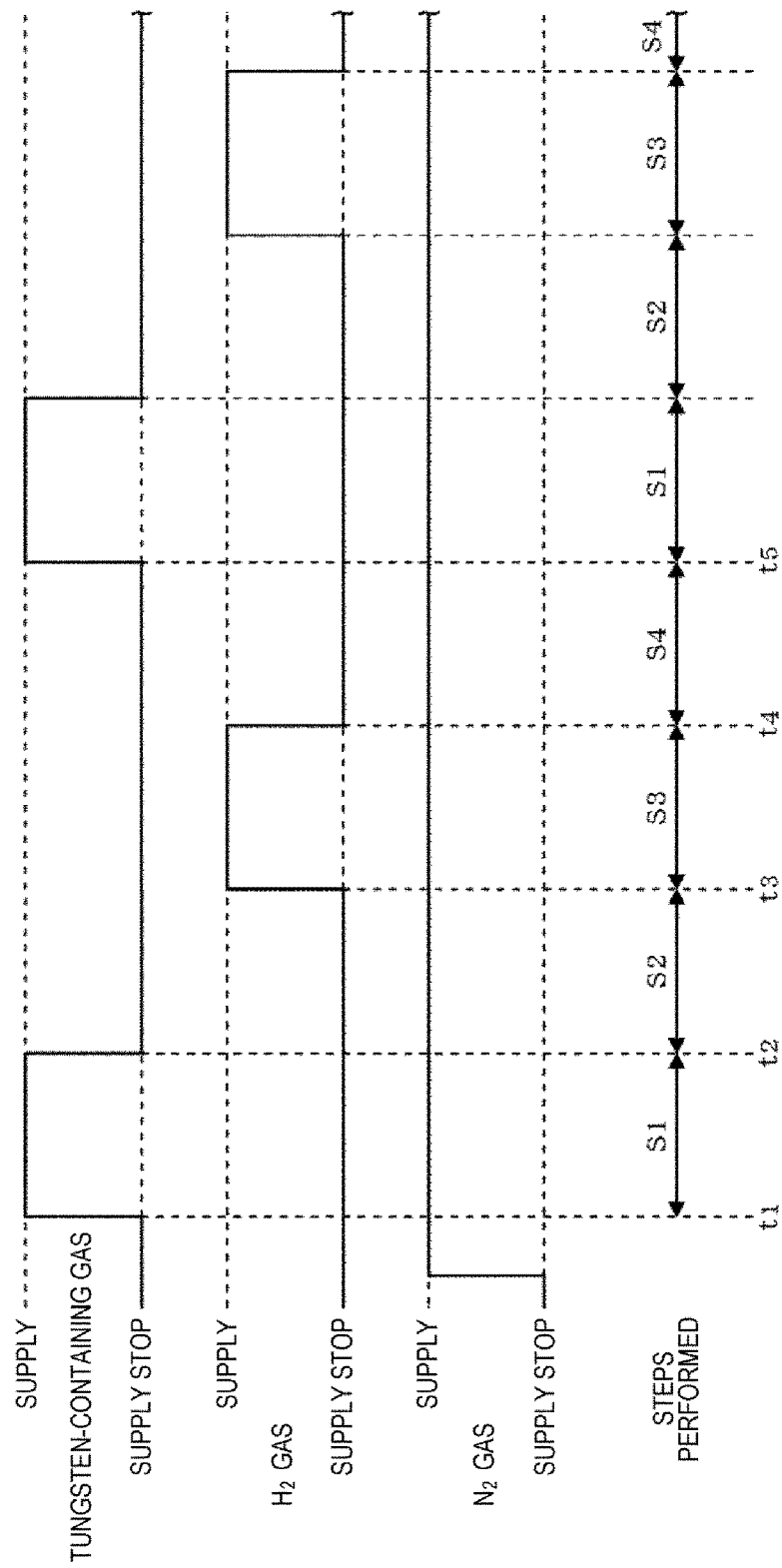
FIG. 9 is a chart showing timings at which various gases are supplied in the processing container.

Subsequently, the film forming process using the film forming apparatus 1 will be described with reference to a timing chart of FIG. 9 as appropriate. This timing chart shows timings at which various kinds of gases are supplied to the gas flow path 5 and timings at which the gas supply is stopped. In addition, the timing chart also shows timings at which steps S1 to S4 to be described later are performed.

First, the interior of the processing container 11 is evacuated, the gate valve 13 is opened under a vacuum atmosphere of a predetermined pressure, and the wafer W is transferred from a transfer chamber under a vacuum atmosphere adjacent to the processing container 11 to the mounting table 21 located at the lower delivery position in the processing container 11 by a transfer mechanism. When the wafer W is delivered to the mounting table 21 by moving-up and moving-down of the support pins 27 and the transfer mechanism is withdrawn from the processing container 11, the gate valve 13 is closed and the mounting table 21 is moved up to the processing position to form the processing space 40. While moving the mounting table 21 up, the wafer W is heated to a predetermined temperature by the heater 22 of the mounting table 21.

The valves V2 and V4 are opened to supply an $N_2$ gas into the processing space 40. Subsequently, the valve V1 is opened to supply a tungsten-containing gas from the gas supply source 73 into the gas flow path 5 of the gas supply unit 3 (at time t1 in the chart). In the gas flow path 5, as described above, the lengths of flow paths from the ports 70 at the upstream end to the gas dispersion parts 41 are already aligned and the tungsten-containing gas is supplied to each gas dispersion part 41 with its aligned flow rate and flow velocity. Then, since the gas dispersion parts 41 are distributed so as to be spaced apart from one another in the circumferential and radial directions of the diffusion space 36, the tungsten-containing gas supplied to the gas dispersion parts 41 as described above is supplied with high uniformity to various parts in the diffusion space 36 and is showered from the shower head 35 toward the wafer W. As a result, the tungsten-containing gas is adsorbed with high uniformity in various parts of the plane of the wafer W (step S1).

Subsequently, the valve V1 is closed (at time t2) to stop the supply of the tungsten-containing gas from the gas dispersing part 41 and the tungsten-containing gas remaining in the processing space 40 that is not adsorbed into the wafer W is purged by the $N_2$ gas supplied from the gas dispersion part 41 (step S2). Thereafter, the valve V3 is opened to supply an $H_2$ gas from the gas supply source 76 to the gas flow path 5 (at time t3). Similar to the tungsten-containing gas, the $H_2$ gas is supplied to each gas dispersion part 41 with its aligned flow rate and flow velocity and is showered from the shower head 35 toward the wafer W. As a result, the $H_2$ gas is supplied to various parts in the plane of the wafer W at a flow rate with high uniformity and reacts with the tungsten-containing gas adsorbed into the wafer W to form a tungsten thin layer as a reaction product (step S3). Thereafter, the valve V3 is closed (at time t4) to stop the supply of the $H_2$ gas from the gas dispersion part 41 and the $H_2$ gas remaining in the processing space 40 without reacting with the tungsten-containing gas is purged by the $N_2$ gas supplied from the gas dispersion part 41 (step S4).

Thereafter, the valve V1 is opened (at time t5) to again supply the tungsten-containing gas onto the wafer W. That is to say, the above-described step S1 shown in FIG. 9 is performed. Subsequently, the steps S2 to S4 are, performed and then, the steps S1 to S4 are further performed. When the steps S1 to S4 are repeated multiple times in this manner, tungsten thin layers are laminated on the surface of the wafer W to form a tungsten film, increasing its film thickness. When the tungsten-containing gas and the $H_2$ gas are supplied with high uniformity to various parts in the plane of the wafer W as described above, the tungsten film in various parts in the plane of the wafer W has a relatively highly-uniform film thickness. When the steps S1 to S4 are repeated a predetermined number of times, the mounting table 21 is moved down, the wafer W is unloaded from the processing container 11 in a reverse order from when the wafer W was loaded into the processing container 11, and then the film forming process is ended.

In this film forming apparatus 1, the gas flow path 5, which is formed such that the downstream side of the common flow path including the ports 70 is branched and connected to a number of gas distribution parts 41, is installed in the gas supply unit 3. In addition, the flow path lengths from the common flow path to the gas dispersion parts 41 are aligned so that the flow rates and flow velocities of gases supplied to the gas dispersion parts 41 are aligned. Furthermore, the gas dispersing parts 41 are installed on the circles R1 centered at the plurality of points P2, which are located on the circle R0 centered at the point P1 of the center of the diffusion space 36 when viewed from a top view and are spaced apart from one another in the circumferential direction. In each of the circles R1, the plurality of gas dispersion parts 41 is installed with different distances from the point P1. Therefore, the gas dispersion parts 41 are distributed in the diffusion space 36 in the circumferential and radial directions. With such a configuration, it is possible to supply the tungsten-containing gas and the $H_2$ gas with high uniformity to various parts in the diffusion space 36. In addition, since each gas diffused in this way can be supplied onto the wafer W through the shower head 35 below the diffusion space 36, it is possible to form a film with high uniformity in the plane of the wafer W.

Figure 10:
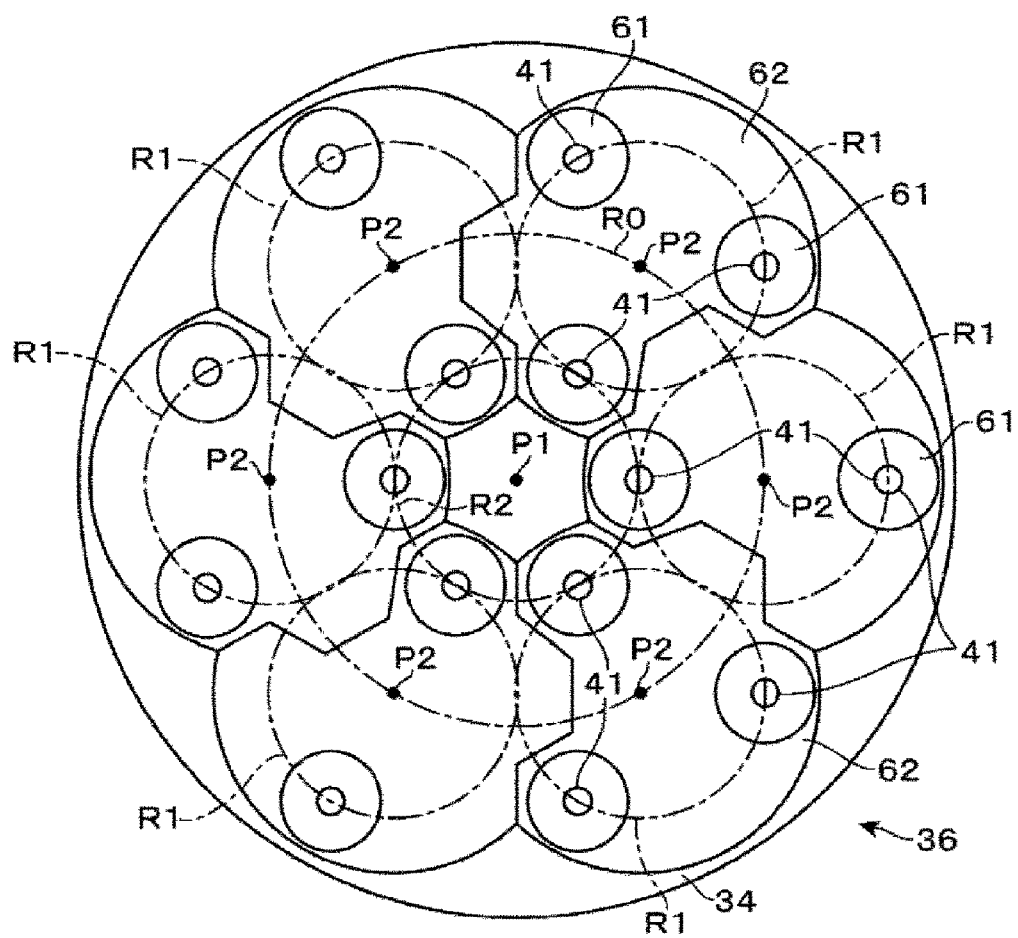
FIG. 10 is a plan view of the ceiling surface in a modification of the first embodiment.

Subsequently, a modification of the first embodiment will be described. A film forming apparatus of this modification is different from the film forming apparatus 1 of the above-described first embodiment in terms of the number of gas dispersion parts 41 installed on the ceiling surface 34 of the processing container 11. FIG. 10 illustrates the ceiling surface 34 of the film forming apparatus of this modification. Some of the gas dispersion parts 41 installed in the ceiling surface 34 illustrated in FIG. 4 are not installed in the ceiling surface 34 of this modification. Specifically, a total of fifteen gas dispersion parts 41 are installed in the ceiling surface 34 of this modification. Assuming that the gas dispersion parts 41 connected to the upstream side branch path as described above are one group, in this modification, the number of gas dispersion parts 41 belonging to one group is two or three. The gas dispersion parts 41 belonging to the same group are arranged at equal intervals on the circles R1 described with reference to FIG. 4. Circles R1 on which three gas dispersion parts 41 belonging to the same group are arranged and circles R1 on which two gas dispersion parts 41 belonging to the same group are arranged are alternately positioned in the circumferential direction. Similarly to the first embodiment, six gas dispersion parts 41 of each group are arranged on the circle R2.

A gas flow path 5 of this modification has the same configuration as the gas flow path 5 of the first embodiment except that fifteen out of the thirty vertical flow paths 50 constituting the downstream end are sealed without being connected to the gas dispersion parts 41. Therefore, also in this modification, the flow path lengths from the common flow path to the gas dispersion parts 41 are aligned.

Second Embodiment

Figure 11:
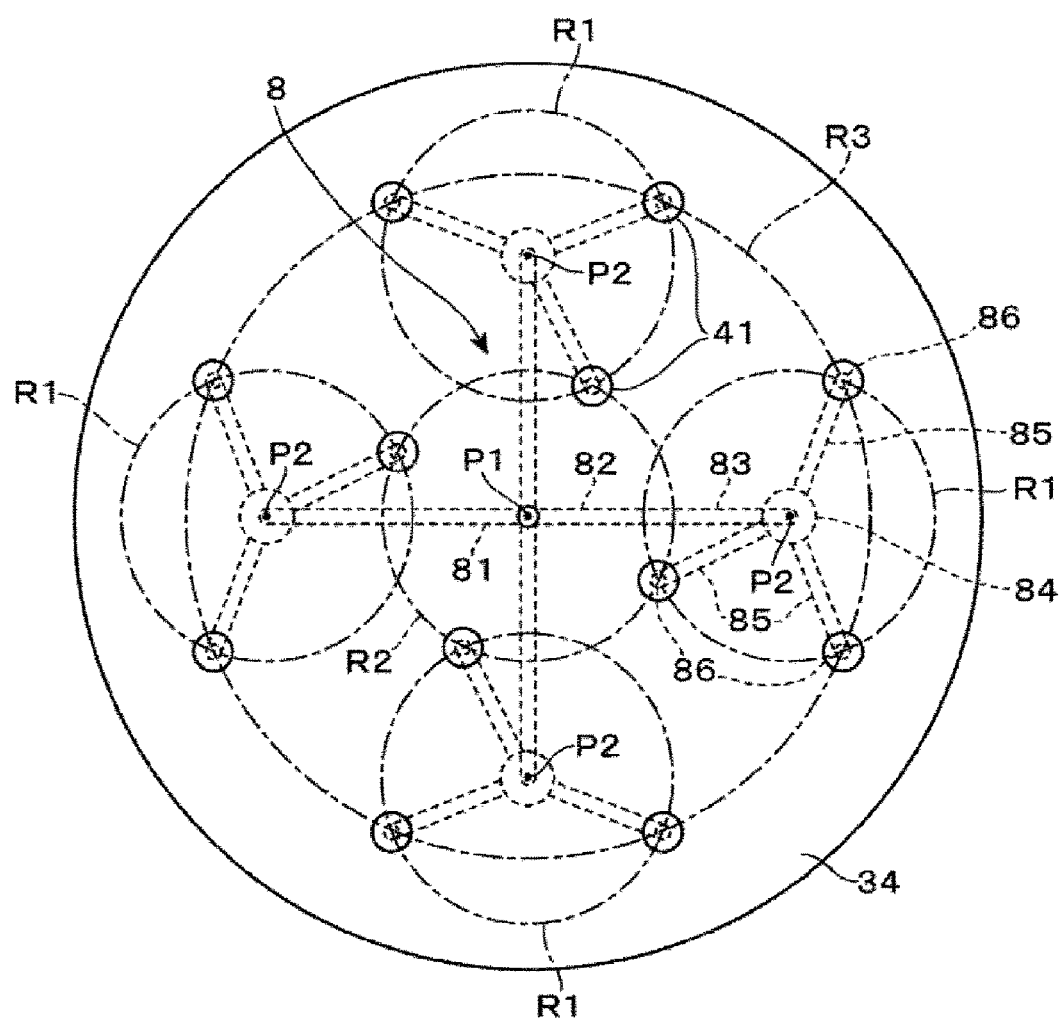
FIG. 11 is a plan view of the ceiling surface in a second embodiment.
Figure 12:
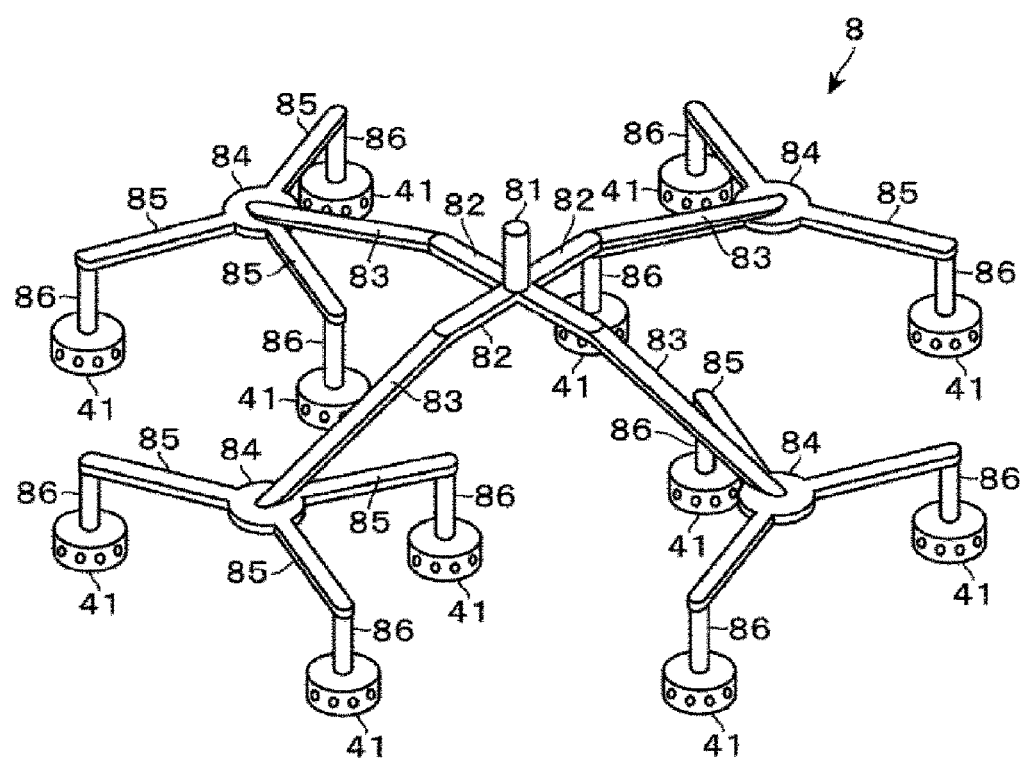
FIG. 12 is a perspective view of the gas flow path in the second embodiment.

Subsequently, a film forming apparatus according to a second embodiment will be described with emphasis placed on differences from the film forming apparatus 1 of the first embodiment. FIG. 11 illustrates a ceiling surface 34 of the film forming apparatus of the second embodiment. In the second embodiment, twelve gas dispersion parts 41 are installed on the ceiling surface 34. In addition, instead of the gas flow path 5, a gas flow path 8 is formed in the gas supply unit 3 in order to introduce a gas into these twelve gas dispersion parts 41. FIG. 12 is a perspective view of the gas flow path 8.

The outline of the gas flow path 8 will be described. The upstream side of the gas flow path 8 forms a common flow path which is common to the twelve gas dispersion parts 41, and the downstream side of the gas flow path 8 branches stepwise like a line diagram which determines a combination of paths and is connected to the gas dispersion parts 41. In more detail, the downstream side of the common flow path branches into four upstream side branch paths. In addition, the downstream side of each of the upstream side branch paths branches into three downstream side branch paths which are connected to the gas dispersion parts 41. Therefore, the number of gas dispersion parts 41 connected to the same upstream side branch path is three. In the second embodiment, it is assumed that these three gas dispersion parts 41 belong to the same group.

As in the first embodiment, a circle centered at a point P2, which is located on a circle R0 centered at a point P1 of the center of the diffusion space 36 when viewed from a top view, is denoted by R1. The circle R0 is not shown in FIG. 11 for the purpose of avoiding complication. In the second embodiment, four points P2 and four circles R1 are set at equal intervals in the circumferential direction. The centers of three gas dispersion parts 41 belonging to the same group are located on one circle R1. In addition, among the gas dispersion parts 41 belonging to the same group, the center of the gas dispersion part 41 closest to the point P1 is located on a circle R2 centered at the point P1. That is to say, the centers of the four gas dispersion parts 41 are located on the circle R2. The centers of the gas dispersion parts 41 not located on the circle R2 are located on a circle R3 which is centered at the point P1 and has a diameter larger than the diameter of the circle R2.

Subsequently, the gas flow path 8 will be described in detail. The gas flow path 8 has a vertical flow path 81 extending in the vertical direction and the center of the vertical flow path 81 coincides with the central point P1 of the diffusion space 36. The downstream ends of the gas supply pipes 71 and 72 for supplying the respective gases to the gas supply unit 3 as described in FIG. 1 are respectively connected to the upper ends of the vertical flow path 81. Therefore, the vertical flow path 81 corresponds to the common flow path described in the outline of the gas flow path 8. In addition, four horizontal flow paths 82 are installed in the lower side of the vertical flow path 81. These horizontal flow paths 82 are installed such that their respective distal ends extend horizontally in different directions so as to form a cross when viewed from a top view and their respective proximal ends coincide with one another. The lower end of the vertical flow path 81 is connected to the proximal ends of the horizontal flow paths 82.

The distal ends of the horizontal flow paths 82 are connected to the proximal ends of inclined flow path 83 extending linearly in the extension direction of the horizontal flow paths 82 when viewed from a top view. Each of the inclined flow paths 83 is inclined so as to descend toward its distal end. The horizontal flow paths 82 and the inclined flow paths 83 correspond to the upstream branch paths described in the outline of the gas flow path 8. The distal ends of the inclined flow paths 83 are respectively connected to the centers of flat circular spaces 84. The centers of the circular spaces 84 are located on the points P2. Three horizontal flow paths 85 linearly extend radially from the side of each circular space 84. The distal ends of these horizontal flow paths 85 are respectively connected to the upper ends of vertical flow paths 86 extending in the vertical direction. The lower ends of the vertical flow paths 86 are connected to the gas dispersion parts 41. The circular spaces 84, the horizontal flow paths 85 and the vertical flow paths 86 are configured as the above-described downstream side branch paths.

The four horizontal flow paths 82, the four inclined flow paths 83, the twelve horizontal flow paths 85, and the twelve vertical flow paths 86 have the same lengths and diameters, respectively. In addition, the four circular spaces 84 have the same size. With this configuration, the flow path lengths from the vertical flow path 81 to the respective gas dispersion parts 41 are aligned and the flow rates and flow velocities of gases supplied into the gas introducing holes 42 of the gas dispersion parts 41 are also aligned. Therefore, similar to the film forming apparatus 1 of the first embodiment, the film forming apparatus of the second embodiment can perform a film forming process so as to achieve high film thickness uniformity for various parts in the plane of the wafer W.

Figure 13:
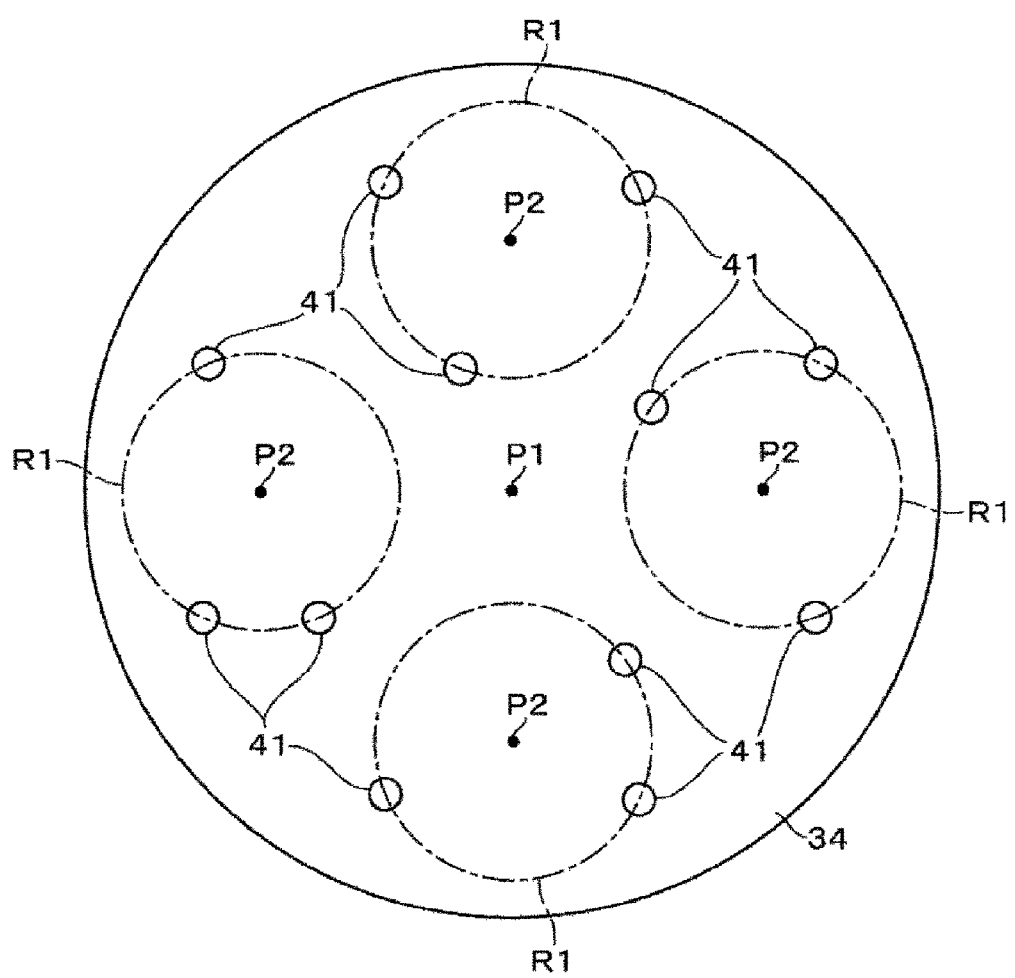
FIG. 13 is a plan view of the ceiling surface in a modification of the second embodiment.

FIG. 13 illustrates the arrangement of gas dispersion parts 41 on a ceiling surface 34 according to a modification of the second embodiment. This modification is different from the second embodiment in terms of a direction in which the horizontal flow path 85 extends from the circular space 84 constituting the gas flow path 8. Thereby, distances between the point P1 of the center of the diffusion space 36 and the gas dispersion parts 41 closest to the point P1 in respective groups are different from one another. As illustrated in this modification, the present disclosure is not limited to making the distances between the point P1 and the gas dispersion parts 41 equal to each other among groups.

In the first and second embodiments, the common flow path branches into two branching stages, that is to say, the upstream side branch paths and the downstream side branch paths. However, the number of branching stages is not limited to two but may be one or three or more. In addition, the number of gas dispersion parts 41 arranged on one circle R1 centered on the point P2 is not limited to the above example but may be four or five or more.

Figure 14:
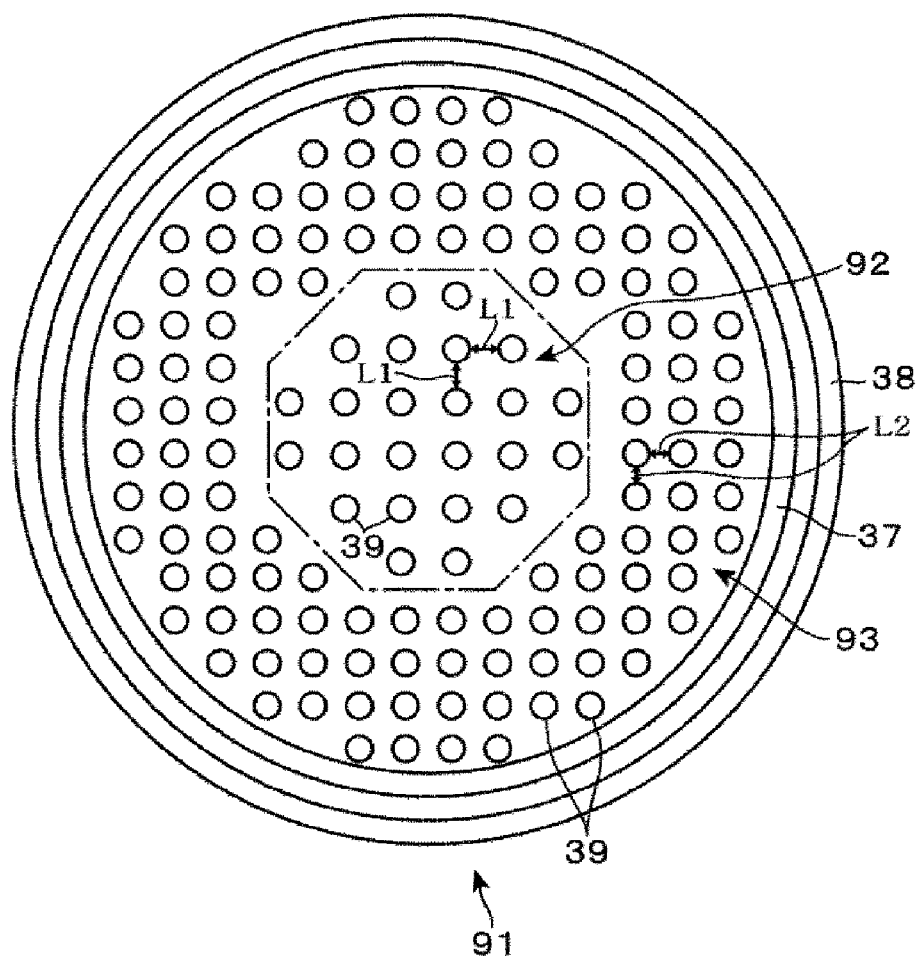
FIG. 14 is a plan view of a shower head installed in each of the gas supply units.

Further, the shower head of the present disclosure is not limited to the shower head 35 as described above. FIG. 14 illustrates a lower surface of a shower head 91. Hereinafter, this shower head 91 will be described with emphasis placed on differences from the shower head 35. In the shower head 91, like the shower head 35, a number of gas injection openings 39 are formed inside annular protrusions 37. A region 92 surrounded by a chain line in FIG. 13 faces the central portion of the mounting table 21. A distance between adjacent gas injection openings 39 in the region 92 is denoted by L1. A region 93 outside the region 92 faces the peripheral portion of the mounting table 21. A distance between gas injection openings 39 in the region 93 is denoted by L2, which is smaller than the distance L1. By setting the distances L1 and L2 in this manner, the shower head 91 is capable of increasing a ratio of (the amount of gas supplied onto the peripheral portion of the wafer W)/(the amount of gas supplied onto the central portion of the wafer W). By adjusting the amount of gases thus, it is possible to adjust the film thickness distribution in the plane of the wafer W. The shower head 91 can be applied to various embodiments described in this specification and modifications thereof.

Third Embodiment

Figure 15:
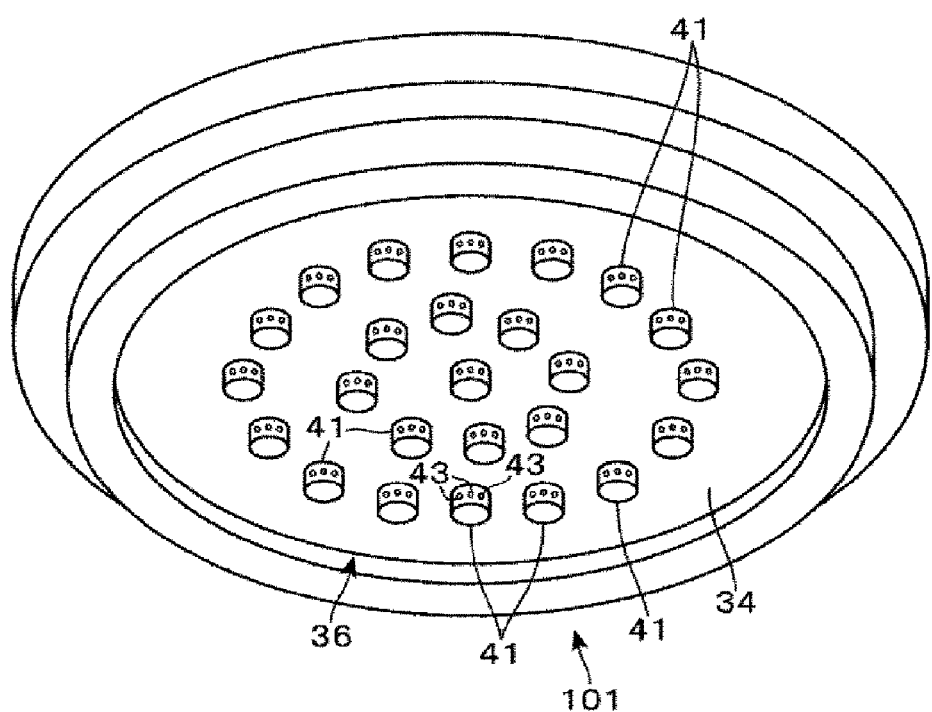
FIG. 15 is a perspective view of the gas supply unit according to a third embodiment.
Figure 16:
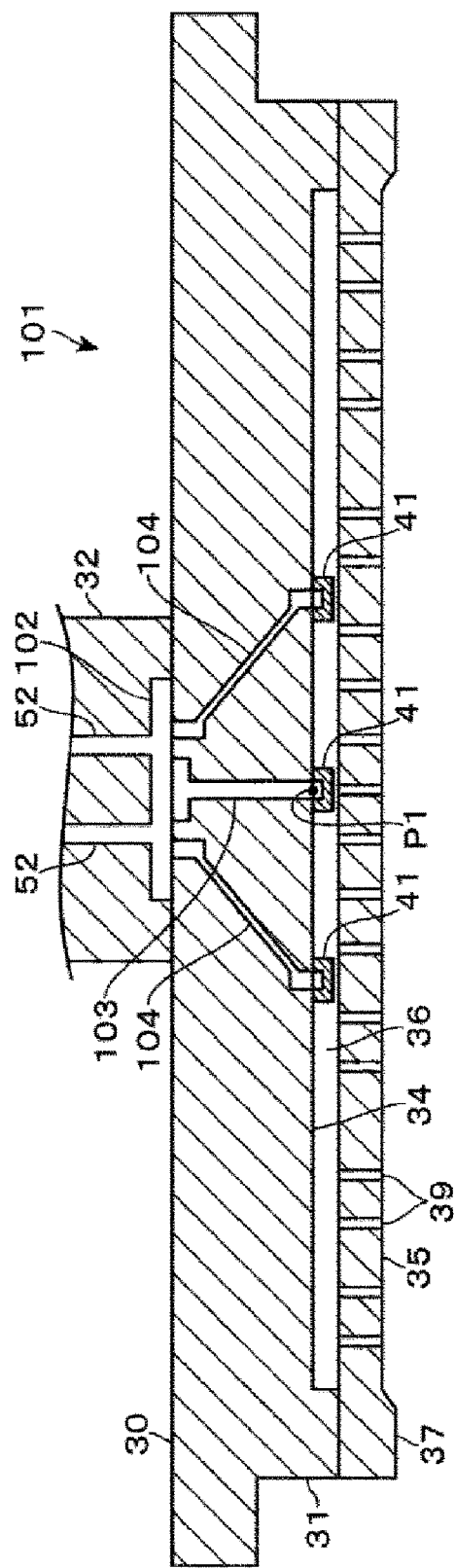
FIG. 16 is a longitudinal cross-sectional view of the gas supply unit.
Figure 17:
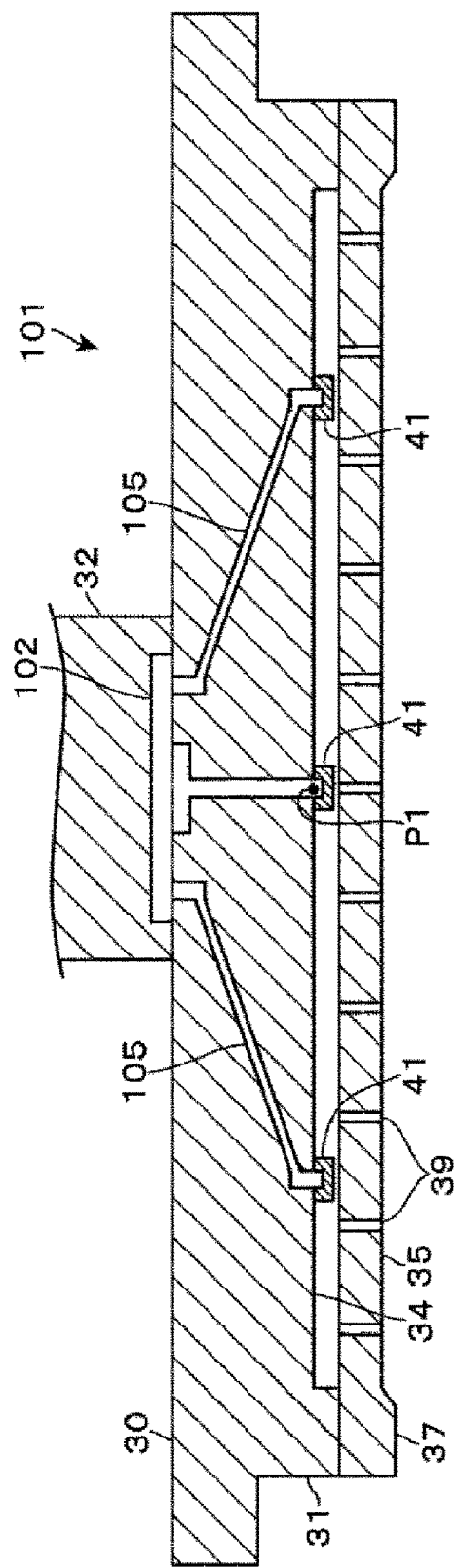
FIG. 17 is a longitudinal cross-sectional view of the gas supply unit.

Subsequently, a gas supply unit 101 installed in a film forming apparatus according to a third embodiment will be described with emphasis placed on differences from the gas supply unit 3 installed in the film forming apparatus 1 according to the first embodiment. The gas supply unit 101 is different from the gas supply unit 3 in terms of the arrangement and number of gas dispersion parts 41. FIG. 15 is a perspective view of the lower side of the gas supply unit 101. However, as shown in the gas dispersion parts 41, the shower head 35 is not shown in FIG. 15. FIGS. 16 and 17 illustrate the longitudinal sections of the gas supply units 101 having directions different by 90 degrees from each other, as in FIGS. 5 and 6. Each of the longitudinal sections passes a point P1 of the center of the diffusion space 36. Gas dispersion parts 41 other than the gas dispersion part 41 showing its section are not shown in FIGS. 16 and 17.

Regarding this gas supply unit 101, one gas dispersion part 41 is disposed on the point P1 of the center of the ceiling surface 34 and other gas dispersion parts 41 are arranged in two rows along concentric circles centered at this point P1. The gas dispersion parts 41 installed along the concentric circles are arranged at equal intervals in the circumferential direction. Eight gas dispersion parts 41 are arranged along the inner circle of the concentric circles. These eight gas dispersion parts 41 are defined as an inner group. In addition, sixteen gas dispersion parts 41 are arranged along the outer circle of the concentric circles. These sixteen gas dispersion parts 41 are defined as an outer group.

Referring to gas flow paths of the gas supply unit 101, a flat space 102 having a relatively large area and located on the central portion of the ceiling surface 34 is formed below the vertical flow path 52 described in the first embodiment. A flow path 103 extends vertically downward from the flat space 102 and is connected to the gas dispersion part 41 located on the point P1.

Further, eight flow paths 104 extend obliquely downward from the flat space 102 and are formed in a radial shape when viewed from a top view. The downstream sides of the eight flow paths 104 are bent so as to extend in the vertical direction and are respectively connected to the gas dispersion parts 41 of the inner group. Furthermore, sixteen flow paths 105 extend obliquely downward from the flat space 102 and are formed in a radial shape when viewed from a top view. The downstream sides of the sixteen flow paths 105 are bent so as to extend in the vertical direction and are respectively connected to the gas dispersion parts 41 of the outer group. When viewed from a top view, the upper ends of the flow paths 104 and the upper ends of the flow paths 105 are arranged on a concentric circle surrounding the point P1. The lengths of the flow paths 103, 104, and 105 are different from one another. The flow paths 103 to 105 and the flat space 102 are formed by stacking blocks in which concave portions, grooves or through-holes are formed, similar to the gas flow path 5 of the first embodiment.

In the third embodiment, since one gas dispersion part 41 is installed at the center of the diffusion space 36 and other gas dispersion parts 41 are arranged at positions away from the center of the diffusion space 36 along the concentric circles centered at the center of the diffusion space 36, it is possible to supply a gas with high uniformity to various parts of the diffusion space 36 and thereby to form a film with high uniformity in various parts in the plane of the wafer W. In the third embodiment, by removing some of the gas dispersion parts 41 arranged as described above and sealing flow paths for supplying a gas to the removed gas dispersion parts 41, it is possible to appropriately adjust a distribution of a processing gas in the diffusion space 36.

The film forming apparatus performing ALD has been described as an exemplary embodiment, but the present disclosure may also be applied to a film forming apparatus performing CVD, even in which case a processing gas can be supplied with high uniformity onto various parts in the plane of the wafer W to perform a film forming process. Further, the present disclosure is not limited to being applied to a film forming apparatus but may also be applied to an etching apparatus that performs an etching process by supplying a processing gas onto a wafer W. The present disclosure is not limited to the examples described above, but these examples may be suitably changed or used in proper combination or the gas species may be changed. In the case of changing the gas species, for example, a TiN film can be formed by using, for example, a $TiCl_4$ gas and an $NH_3$ gas.

Hereinafter, evaluation tests carried out in connection with the present disclosure will be described. As an evaluation test 1, a film forming apparatus having the gas flow path 8 described in the second embodiment was set by a simulation and the standard deviation 1σ was calculated for mole fractions of a processing gas in the plane of a wafer W when the processing gas is supplied onto the wafer W. In this simulation, the height from the shower head 35 to the surface of the wafer W was set to be 2 mm. The supply time of the processing gas was set to be 0.1 second.

Figure 18:
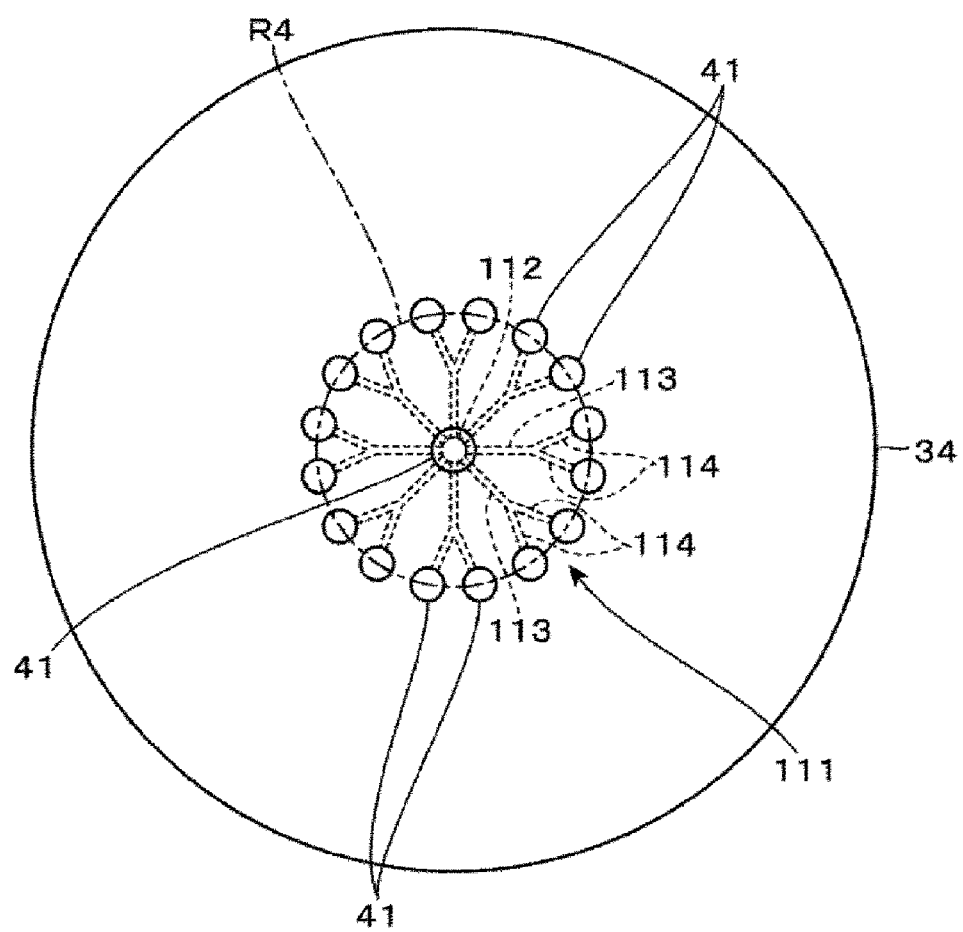
FIG. 18 is a plan view of a gas supply unit used in a comparative test.

As a comparative test 1, a film forming apparatus having a gas flow path 111 instead of the gas flow path 8 was set by a simulation. FIG. 18 is a plan view schematically illustrating the gas flow path 111. The gas flow path 111 includes: a vertical flow path 112 for supplying a gas vertically downward; eight horizontal flow paths 113 connected with the lower end of the vertical flow path 112 for diffusing the gas horizontally on the central portion of the ceiling surface 34 and radially when viewed from a top view; and two inclined flow paths 114 branching from the distal end of each horizontal flow path 113 and extending obliquely downward, with the gas dispersion parts 41 connected to the distal ends of the inclined flow paths 114. The gas dispersion parts 41 connected to the inclined flow paths 114 are arranged along a virtual circle R4 centered at a point P of the center of the ceiling surface 34.

Further, a flow path (not shown) extends downward from the vertical flow path 112 and is connected to the gas dispersion part 41 installed at the central portion of the ceiling surface 34. Therefore, the gas dispersion parts 41 arranged along the circle R4 and the gas dispersion part 41 installed at the central portion of the ceiling surface 34 have different lengths of flow paths reaching the vertical flow path 112 shared by these gas dispersion parts 41. In the comparative test 1, a simulation was performed under the same conditions as in the evaluation test 1 except for the different gas flow paths as described above, and the standard deviation 1σ was calculated for mole fractions of a film forming gas in the plane of the wafer W.

The standard deviation 1σ calculated in the evaluation test 1 was $3.85×10\%$, and the standard deviation 1σ calculated in the comparative test 1 was $3.65×10^{-4}\%$. As apparent, the standard deviation 1σ in the evaluation test 1 was smaller than that in the comparative test 1. Therefore, in the evaluation test 1, the film forming gas was supplied with higher uniformity in the plane of the wafer W and the effects of the present disclosure was shown from this evaluation test 1.

As an evaluation test 2, a film forming process was performed on the wafer W using the film forming apparatus according to the modification of the first embodiment described with reference to FIG. 10. For a film formed on the surface of the wafer W. the sheet resistances (ohm/sq) at various parts in the plane of the wafer W were measured. The average value of the sheet resistances was 4.19 ohm/sq and 1σ/average value×100 (unit: %) was 13.89%, which does not show a large difference from 1σ/average value×100 obtained by performing the same evaluation test as the evaluation test 2 using the film forming apparatus having the gas flow path 111 described in the comparative test 1. However, in the evaluation test 2, by adjusting the arrangement of the gas dispersion parts 41 and the hole diameter of the gas discharge ports 43 of the gas dispersion parts 41, it may be possible to improve 1σ/average value×100, that is to say, the film thickness uniformity in the plane of the wafer W.

According to the present disclosure in some embodiments, the gas treatment apparatus includes: a gas diffusion plate for injecting a processing gas in a shower shape; a plurality of gas dispersion parts for discharging and dispersing the processing gas horizontally in a diffusion space above the gas diffusion plate; and a flow path of the processing gas, the flow path having an upstream side forming a common flow path common to the gas dispersion parts and a downstream side branched in a middle of the flow path and connected to each of the gas dispersion parts so that the lengths from the common flow path to the gas dispersion parts are aligned. The gas dispersion parts are arranged in a layout in which the centers of the gas dispersion parts are located around the central portion of the diffusion space when viewing the diffusion space from a top view and the gas dispersion parts are arranged along a plurality of circles in the circumferential direction of the diffusion space. In the layout, two or more gas dispersion parts are arranged on one of the plurality of circles, with the distances from the central portion of the diffusion space to the gas dispersion parts being different from one another. With such a configuration, it is possible to perform a process by supplying the processing gas with high uniformity to the plane of the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gas treatment apparatus that performs a gas treatment by supplying a processing gas to a substrate in a processing chamber under a vacuum atmosphere, comprising:
   a mounting part installed in the processing chamber and on which the substrate is mounted;
   a gas diffusion plate which forms a ceiling part located above the mounting part and has a plurality of gas injection openings formed to inject the processing gas in a shower shape;
   a plurality of gas dispersion parts installed in an opposing part, which faces the gas diffusion plate and is located above the gas diffusion plate via a diffusion space of the processing gas, the plurality of gas dispersion parts having a plurality of gas discharge ports formed along a circumferential direction so as to disperse the processing gas horizontally in the diffusion space; and
   a dozy path of the processing gas, the flow path having an upstream side forming a common flow path common to the plurality of gas dispersion parts and a downstream side branched in a middle of the flow path and connected to each of the plurality of gas dispersion parts, lengths from the common flow path to each of the plurality of gas dispersion parts, respectively, being aligned,
   wherein the plurality of gas dispersion parts is arranged in a layout in which:
      centers of each of the plurality of gas dispersion parts are located around a central portion of the diffusion space when viewing the diffusion space from a top view; and
      the plurality of gas dispersion parts is arranged along a plurality of first circles in a circumferential direction of the diffusion space, with two or more of the plurality of gas dispersion parts arranged on each of the plurality of first circles, and with distances from the central portion of the diffusion space to the centers of each of the plurality of gas dispersion parts being different from one another.

2. The apparatus of claim 1, wherein the flow path is formed to branch, from the common flow path to the plurality of gas dispersion parts, stepwise like a line diagram which determines a combination of paths.

3. The apparatus of claim 1, wherein three or more of the plurality of gas dispersion parts are arranged along the each of the plurality of first circles.

4. The apparatus of claim 1, wherein the plurality of gas dispersion parts arranged along each of the plurality of first circles is arranged along a second circle centered at the central portion of the diffusion space.

5. The apparatus of claim 1, wherein the gas diffusion plate includes a first opposing region facing a central portion of the mounting part and a second opposing region facing a peripheral portion of the mounting part, and
   wherein a distance between adjacent gas injection openings is larger in the first opposing region than in the second opposing region.

6. A gas treatment method that performs a gas treatment by supplying a processing gas to a substrate in a processing chamber under a vacuum atmosphere, the method comprising:
   mounting the substrate on a mounting part installed in the processing chamber;
   injecting the processing gas in a shower shape from a plurality of gas injection openings formed in a gas diffusion plate forming a ceiling part located above the mounting part;
   dispersing the processing gas in a diffusion space of the processing gas by discharging the processing gas horizontally from a plurality of gas dispersion parts installed in an opposing part, which faces the gas diffusion plate and is located above the gas diffusion plate via the diffusion space, the plurality of gas dispersion parts having a plurality of gas discharge ports formed along a circumferential direction; and
   supplying the processing gas into a flow path having an upstream side forming a common flow path common to the plurality of gas dispersion parts and a downstream side branched in a middle of the flow path and connected to each of the plurality of gas dispersion parts, lengths from the common flow path to each of the plurality of gas dispersion parts, respectively, being aligned,
   wherein the plurality of gas dispersion parts is arranged in a layout in which:
      centers of each of the plurality of gas dispersion parts are located around a central portion of the diffusion space when viewing the diffusion space from a top view; and
      the plurality of gas dispersion parts is arranged along a plurality of first circles in a circumferential direction of the diffusion space, with two or more of the plurality of gas dispersion parts arranged on each of the plurality of first circles, and with distances from the central portion of the diffusion space to the centers of each of the plurality of gas dispersion parts being different from one another.

* * * * *

UNITED STATES PATENT AND TRADEMARK OFFICE
CERTIFICATE OF CORRECTION

PATENT NO. : 10,156,014 B2
APPLICATION NO. : 15/843551
DATED : December 18, 2018
INVENTOR(S) : Takashi Kakegawa et al.

Page 1 of 1

It is certified that error appears in the above-identified patent and that said Letters Patent is hereby corrected as shown below:

In the Claims

Claim 1, Column 17, Line 39, please delete the phrase "a dozy path" and replace with "a flow path".

Signed and Sealed this
Twelfth Day of February, 2019

Andrei Iancu
*Director of the United States Patent and Trademark Office*